(12) United States Patent
Chou et al.

(10) Patent No.: US 11,367,616 B2
(45) Date of Patent: Jun. 21, 2022

(54) METHOD OF PATTERNING MATERIAL LAYER

(71) Applicant: Taiwan Semiconductor Manufacturing Co., Ltd., Hsinchu (TW)

(72) Inventors: You-Hua Chou, Hsinchu (TW); Kuo-Sheng Chuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 95 days.

(21) Appl. No.: 16/931,459

(22) Filed: Jul. 17, 2020

(65) Prior Publication Data
US 2021/0035804 A1    Feb. 4, 2021

Related U.S. Application Data

(60) Provisional application No. 62/880,670, filed on Jul. 31, 2019.

(51) Int. Cl.
*H01L 21/033*    (2006.01)
*H01L 21/3213*    (2006.01)

(52) U.S. Cl.
CPC ...... *H01L 21/0337* (2013.01); *H01L 21/0338* (2013.01); *H01L 21/32139* (2013.01)

(58) Field of Classification Search
CPC ............. H01L 21/0337; H01L 21/0338; H01L 21/32139
See application file for complete search history.

(56) References Cited

U.S. PATENT DOCUMENTS

| | | | |
|---|---|---|---|
| 8,796,666 B1 | 8/2014 | Huang et al. | |
| 9,012,132 B2 | 4/2015 | Chang | |
| 9,093,530 B2 | 4/2015 | Huang et al. | |
| 9,028,915 B2 | 5/2015 | Chang et al. | |
| 9,146,469 B2 | 9/2015 | Liu et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 2013/0161773 A1* | 6/2013 | Dierre ............... | H01L 27/14696 438/73 |

OTHER PUBLICATIONS

Chao-An Jong, "Silver Interconnect Technology," NDL Communications, vol. 20, Issue 1, Mar. 1, 2013, pp. 26-33.
R. J. H. Voorhoeve et al., "Selective Deposition of Silver on Silicon by Reaction with Silver Fluoride Vapor." Journal of The Electrochemical Society, vol. 119, No. 3, Mar. 1972, pp. 364-368.

* cited by examiner

*Primary Examiner* — Walter H Swanson
(74) *Attorney, Agent, or Firm* — JCIPRNET

(57) ABSTRACT

A method of patterning a material layer includes the following steps. A first material layer is formed over a substrate, and the first material layer includes a first metal compound. Through a first photomask, portions of the first material layer is exposed with a gamma ray, wherein a first metal ion of the first metal compound in the portions of the first material layer is chemically reduced to a first metal grain. Other portions of the first material layer are removed to form a plurality of first hard mask patterns including the first metal grain.

20 Claims, 9 Drawing Sheets

METHOD OF PATTERNING MATERIAL LAYER

CROSS-REFERENCE TO RELATED APPLICATION

This application claims the priority benefit of U.S. provisional application Ser. No. 62/880,670, filed on Jul. 31, 2019. The entirety of the above-mentioned patent application is hereby incorporated by reference herein and made a part of this specification.

BACKGROUND

Integrated circuit (IC) design becomes more challenging as IC technologies continually progress towards smaller feature sizes, such as 32 nm, 28 nm, 20 nm or less. Smaller feature sizes require ever shrinking pitch (i.e., a center-to-center distance between IC features) and critical dimension (i.e., a smallest achievable dimension for an IC feature). Although existing lithography processes have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
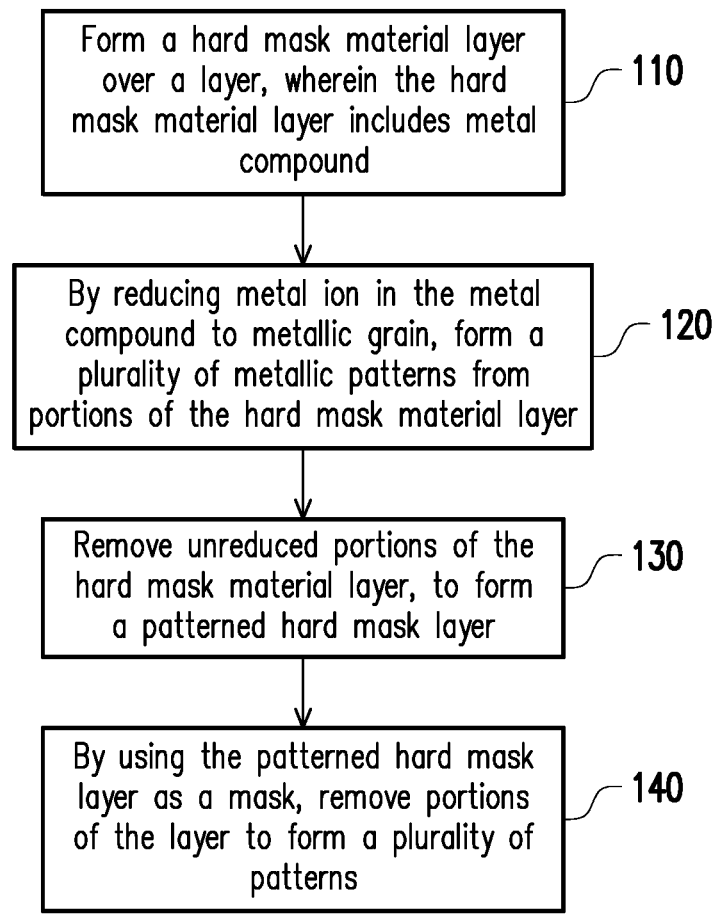
FIG. 1 is a flow chart of a patterning method in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 is a flow chart of a patterning method in accordance with some embodiments. FIG. 2A to FIG. 2E are schematic cross-sectional views of a patterning method in accordance with some embodiments.

Figure 2A:
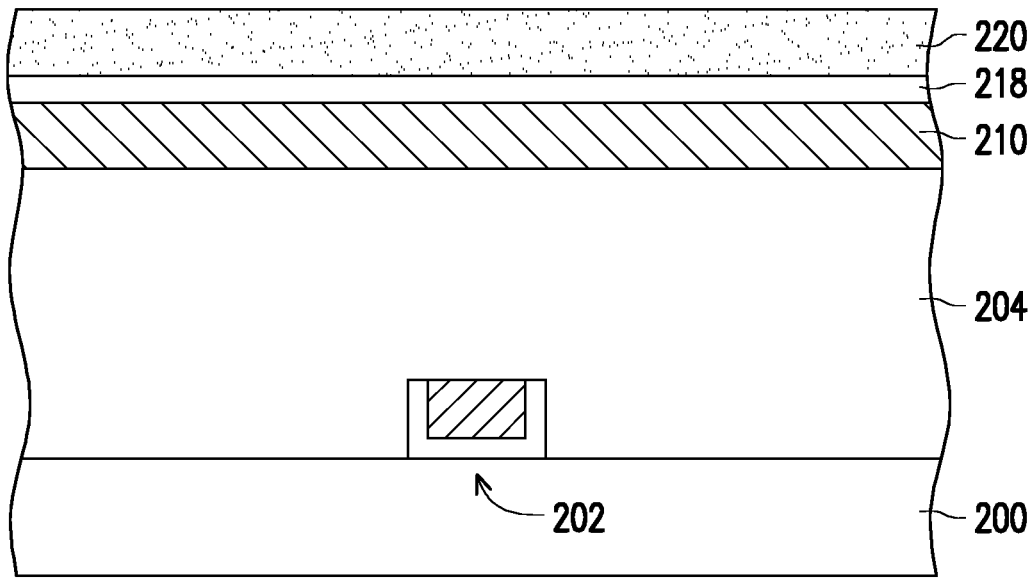
FIG. 2A to FIG. 2E are schematic cross-sectional views of a patterning method in accordance with some embodiments.

Referring to FIGS. 1 and 2A, at step 110, a hard mask material layer 220 is formed over a layer 210, and the hard mask material layer 220 includes metal compound. In some embodiments, the layer 210 is formed over a substrate 200. In some embodiments, the substrate 210 includes an elementary semiconductor such as silicon or germanium, a compound semiconductor such as SiC or SiGe, a combination thereof, or the like. In some embodiments, the layer 210 is a dielectric layer, a conductive layer or other suitable layer to be patterned. The dielectric layer includes nitride such as silicon nitride, oxide such as silicon oxide, phosphosilicate glass (PSG), borosilicate glass (BSG), boron-doped phosphosilicate glass (BPSG), a combination thereof, or the like. The conductive layer includes copper, aluminum, titanium, nickel, tungsten, a combination thereof, or the like. In some alternative embodiments, the layer 210 is omitted, in other words, the substrate 200 is subject to the patterning method.

In some embodiments, a device 202 (e.g., gate strip) is disposed between the substrate and the layer 210. The device 202 may be a portion of an integrated circuit chip or a system on chip (SoC), that includes various passive and active microelectronic devices, such as resistors, capacitors, inductors, fuses, diodes, P-channel field effect transistors (PFETs), N-channel field effect transistors (NFETs), metal-oxide-semiconductor FETs (MOSFETs), complementary MOS (CMOS) transistors, high voltage transistors, high frequency transistors, other suitable components, or combinations thereof. In some embodiments, an interlayer 204 is provided between the device 202 and the layer 210. The interlayer 204 may include a portion of an interconnection layer structure that is electrically connected to the underlying device 202. For example, the interlayer 204 may include at least one metal feature embedded by at least one dielectric layer.

Then, the hard mask material layer 220 is formed over the layer 210. In some embodiments, the metal compound is photosensitive, that is, a metal ion in the metal compound is chemically reduced to a metal grain when exposed by a ray such as gamma ray. The metal compound includes an inorganic metal salt, an organic metal salt, an organo-metal complex or the like. In some embodiments, the metal compound may be silver salt such as silver halide (e.g., silver fluoride, silver chloride, silver bromide or silver iodide), silver nitrate, silver acetate, silver carbonate, the like, or combinations thereof. For example, when the silver salt is irradiated by the gamma ray, silver ion ($Ag^+$) in the silver salt is chemically reduced to metallic silver (Ag). In other words, a chemical reduction reaction occurs when the hard mask material layer 220 is exposed by the ray. However, the disclosure is not limited thereto. In some embodiments, a thickness of the hard mask material layer 220 is in a range of 0.1 nm to 3 nm. In some embodiments, the method of forming the hard mask material layer 220 includes a spreading process, a spin-on coating process or the like. For example, the silver salt is dissolved in a polar solvent (e.g. water, ethanol, methanol, tetrahydrofuran, diethylether, acetone, dimethylsulfoxide or dimethylformamide), and then the formed solution is coated on the layer 210. In some embodiments, the metal compound content in the solution is at least 0.1 mole/liter. In some embodiments, due to the use of the silver compound as the hard mask material, the patterning method may be performed in a dark environment, to prevent the decomposition of the silver compound. In some embodiments, an adhesion layer 218 is further formed between the layer 210 and the hard mask material layer 220. The adhesion layer 218 is configured to enhance the adhesion of the hard mask material layer 220 onto the layer 210. A material of the adhesion layer 218 includes oxide such as silicon oxide. A thickness of the adhesion layer 218 is in a range of 0.1 nm to 1 nm, for example.

Figure 2B:
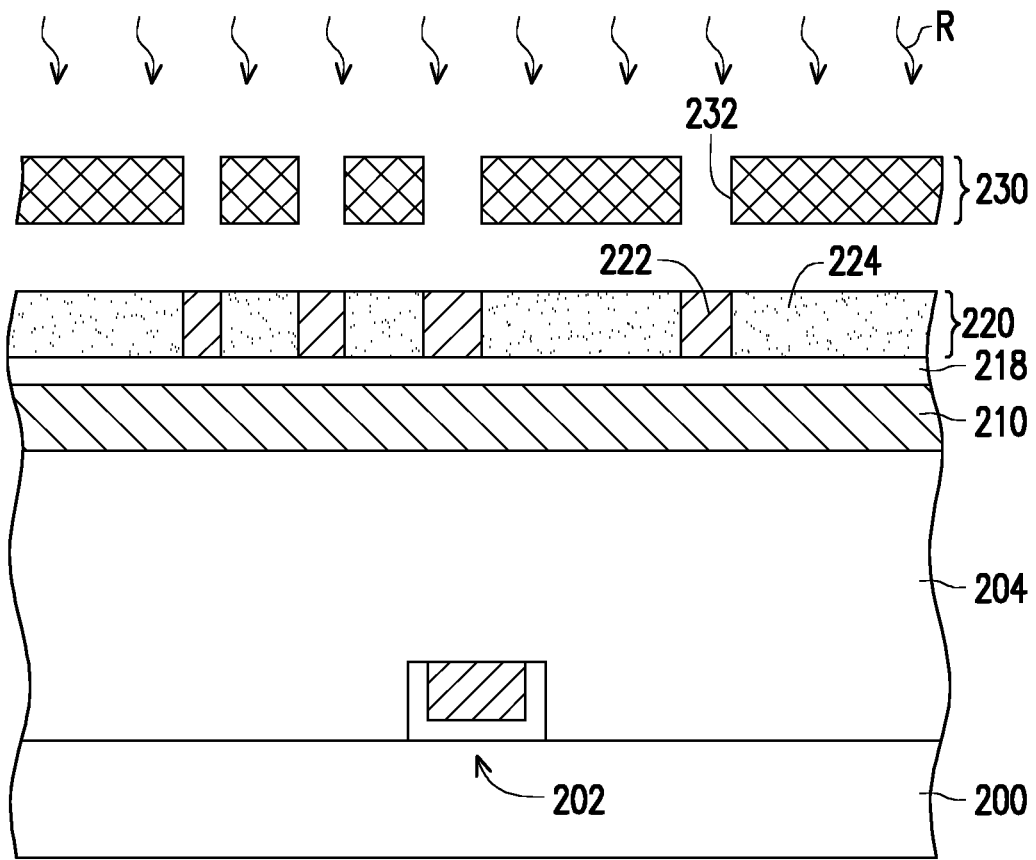

Referring to FIGS. 1 and 2B, at step 120, by reducing metal ion in the metal compound to metallic grain, a plurality of metallic patterns 222 are formed from portions of the hard mask material layer 220. In some embodiments, through a photomask 230, portions of the hard mask material layer 220 are exposed by a ray R, and other portions 224 of the hard mask material layer 220 are covered without exposure. In some embodiments, the ray R may be gamma ray, X ray or the like and provided by a lithography system such as gamma ray lithography system, x ray lithography system or the like. The portions exposed with the ray R are chemically reduced to the metallic patterns 222. In other words, a chemical reduction reaction occurs when the hard mask material layer 220 is irradiated by the ray R. For example, when the silver salt is irradiated by the gamma ray, silver ion ($Ag^+$) in the silver salt is chemically reduced to metallic silver (Ag). In some embodiments, a metal content of the metallic patterns 222 is at least 60%, 70%, 80%, 90% and 100%. In some embodiments, the metallic pattern 222 are substantially pure metal. For example, the metallic pattern 222 are substantially pure silver. In some embodiments, one metallic pattern 222 substantially includes metal grains reduced from metal ions.

In some embodiments, the photomask 230 is a patterned photomask and includes a plurality of openings 232. For example, the photomask 230 has a lattice form, that is, the openings 232 are arranged in a matrix form. However, another arrangement of the openings 232 to the photomask 230 may be deployed depending on fabrication requirements. The width of each of the openings 232 may range from about 2 nm to about 50 nm, but is not limited thereto. The photomask 230 selectively allows portions of the ray R to travel toward the substrate 200 and blocks the other portion of the ray R. In some embodiments, if the ray R is gamma ray, the photomask 230 may include a gamma ray shielding material, such as tungsten, lead, combinations thereof, and/or another suitable material. The chemical reduction of the metal compound may depend on the exposure condition such as the intensity (e.g., strength) of the ray R and the like.

Figure 2C:
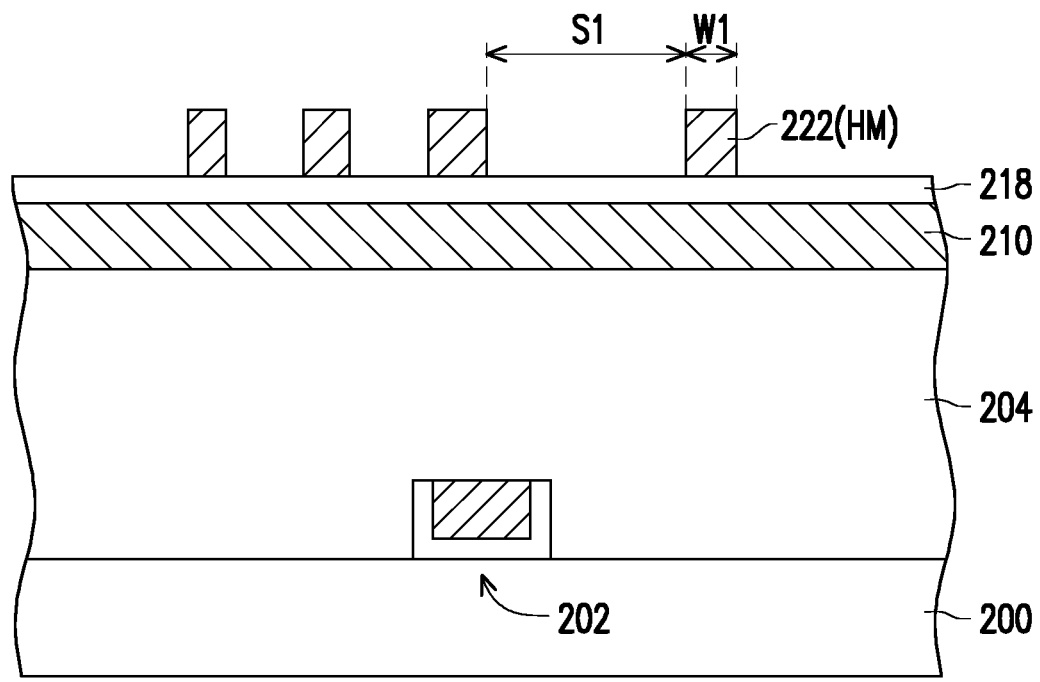

Referring to FIGS. 1 and 2C, at step 130, after the exposure, unreduced portions 224 of the hard mask material layer 220 are removed, to form a patterned hard mask layer HM. In some embodiments, the unreduced portions 224 of the hard mask material layer 220 may be removed by a wet clean process or other suitable method. As shown in FIG. 2C, after the unreduced portions 224 of the hard mask material layer 220 are removed, the metallic patterns 222 are separated from each other. The metallic patterns 222 also referred to as hard mask patterns. In some embodiments, the metallic patterns 222 may have different sizes (e.g., width, height, length). The width W1 of the metallic pattern 222 is in a range of 0.1 nm to 30 nm, for example. The height of the metallic pattern 222 is in a range of 0.1 nm to 3 nm, for example. In some embodiments, a spacing S1 is formed between the metallic patterns 222. The spacing S1 between the metallic patterns 222 is in a range of 0.1 nm to 50 nm.

Figure 2D:
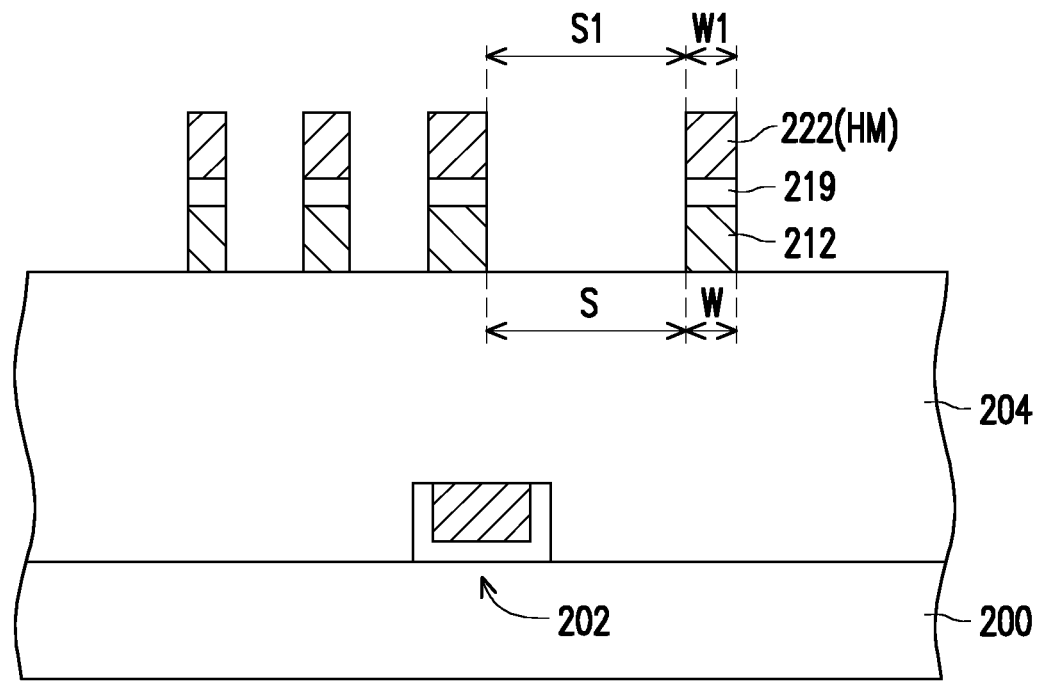

Referring to FIGS. 1 and 2D, at step 140, by using the patterned hard mask layer HM as a mask, portions of the layer 210 are removed to form a plurality of patterns 212. In some embodiments, an etching process such as a wet etching process or a dry etching process is performed on the layer 210, so as to form a plurality of patterns 212 corresponding to the metallic patterns 222. That is, a line width W of the patterns 212 is substantially the same as the width W1 of the metallic patterns 222, and a spacing S between the patterns 212 is substantially the same as the spacing S1 between the metallic patterns 222. In some embodiments, the line width W of the patterns 212 is in a range of 0.1 nm to 50 nm, and the spacing S between the patterns 212 is in a range of 0.1 nm to 50 nm. In some embodiments, if the etching selectivity between the adhesion layer 218 and the layer 210 is low (e.g., smaller than 100) with respect to an etchant used in the etching process, the adhesion layer 218 may be simultaneously patterned with the layer 210, to form a plurality of adhesion patterns 219 between the metallic patterns 222 and the patterns 212.

Figure 2E:
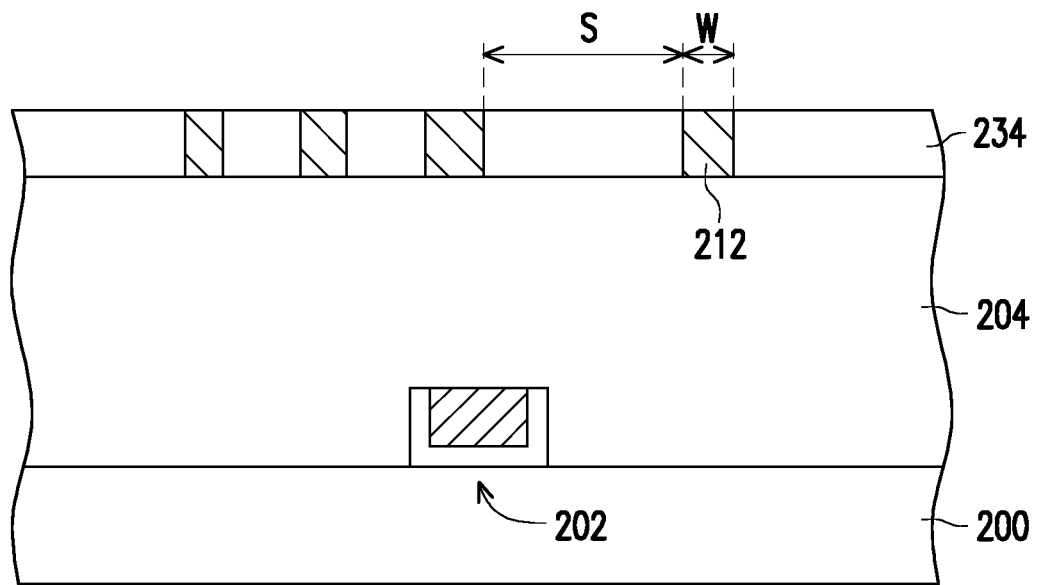

Referring to FIG. 2E, the patterned hard mask layer HM is removed. In some embodiments, the patterned hard mask layer HM may be removed by using a removal solution such as a hydrogen peroxide solution. Further, in some embodiments, the adhesion patterns 219 may be simultaneously removed with the patterned hard mask layer HM, in other words, the metallic patterns 222 and the adhesion patterns 219 therebeneath may be removed by the same process. However, the disclosure is not limited thereto. In some alternative embodiments, the metallic patterns 222 and the adhesion patterns 219 may be removed separately by different processes.

Then, a plurality of patterns 234 may be formed between the patterns 212. For example, a layer is formed in openings between the patterns 212 and covers the patterns 212, and then portions of the layer are removed by a planarization process. In some embodiments, the patterns 212 may be conductive patterns and have a critical dimension (e.g., line width) equal to W, and the patterns 234 may be dielectric patterns to provide electrical insulation between the patterns 212. In some alternative embodiments, the patterns 212 may be dielectric patterns, and the patterns 234 may be conductive patterns to function as conductive lines, conductive vias or the like.

Figure 3A:
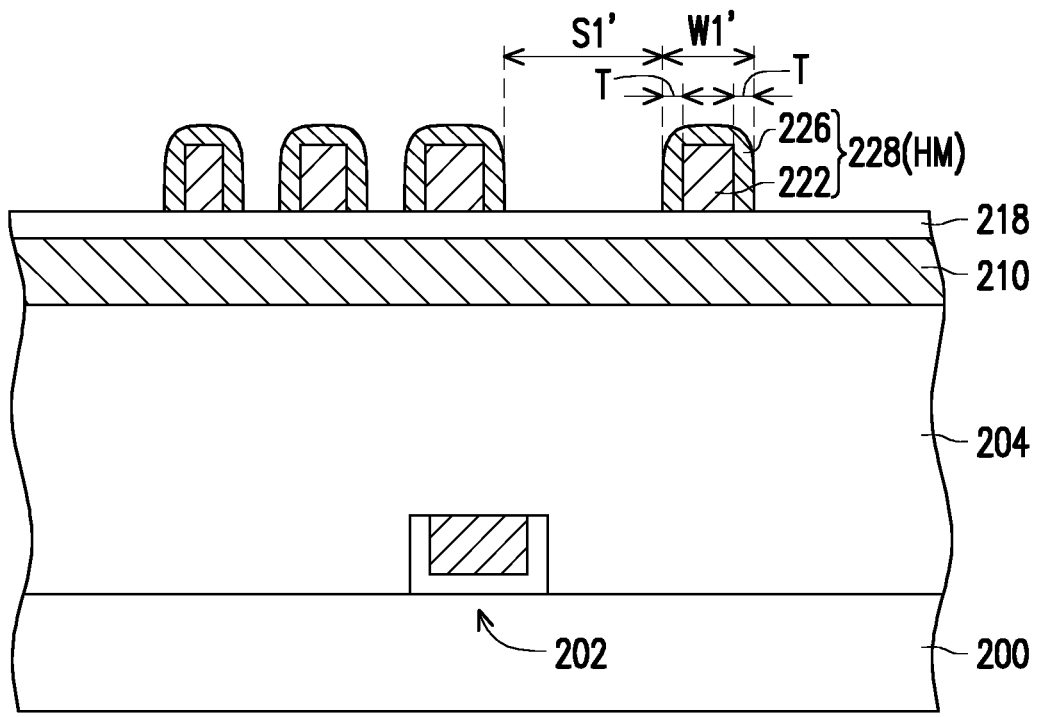
FIG. 3A to FIG. 3C are schematic cross-sectional views of a patterning method in accordance with some embodiments.
Figure 3B:
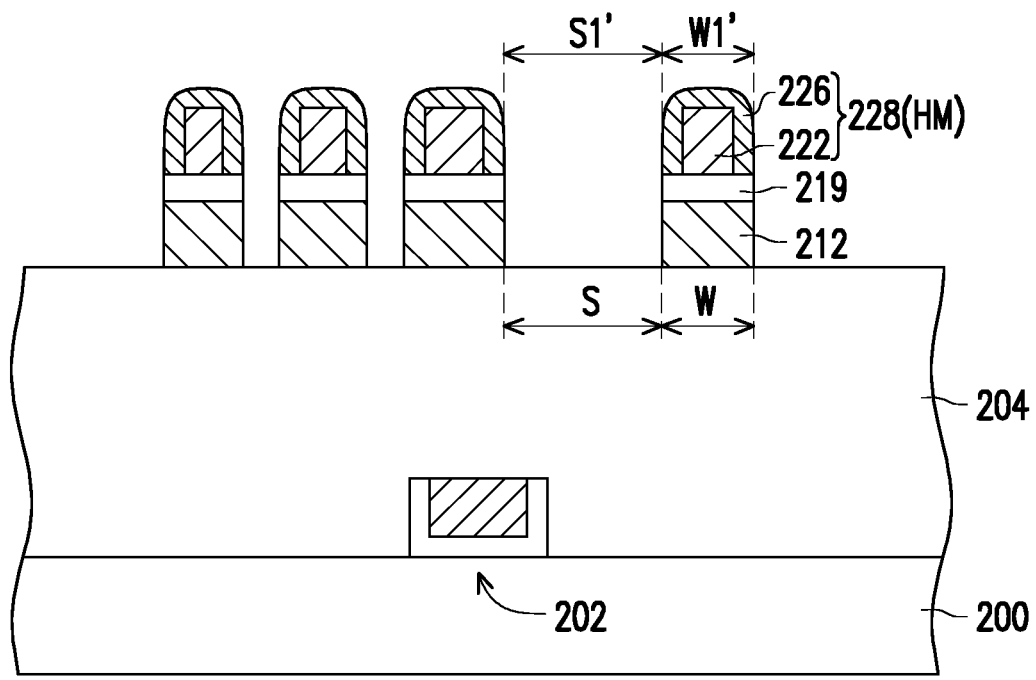
Figure 3C:
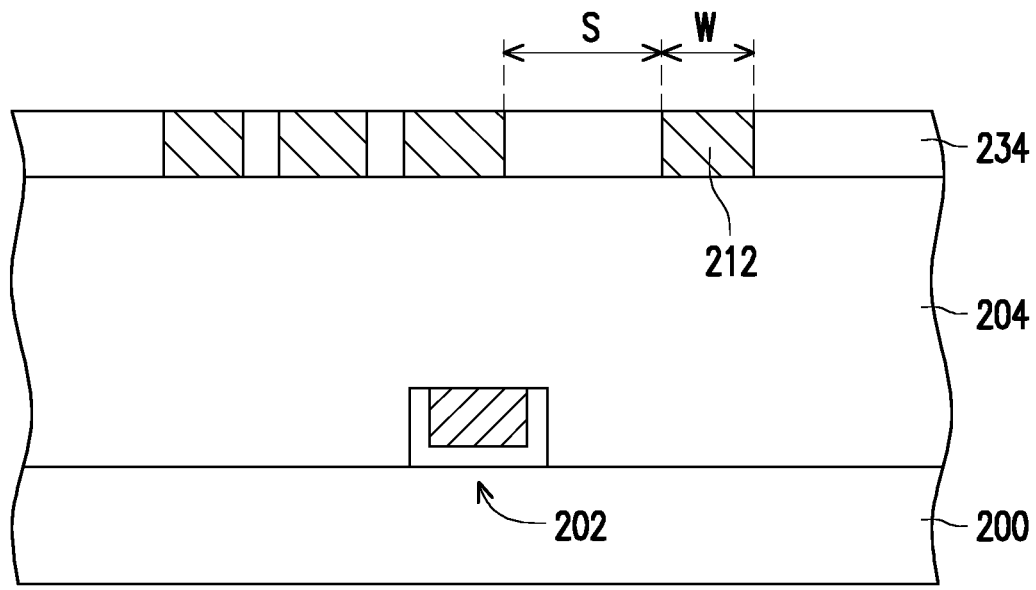

FIG. 3A to FIG. 3C are schematic cross-sectional views of a patterning method in accordance with some embodiments. The step of FIG. 3A may be performed next to the step of FIG. 2C, hence the same reference numerals are used to refer to the same and liked parts, and its detailed description will be omitted herein. The difference is illustrated in details below.

Referring to FIG. 3A, after forming a plurality of metallic patterns 222, a plurality of metallic layer 226 are formed on the metallic patterns 222 respectively, to form a patterned hard mask layer HM. The metallic layers 226 may be selectively formed on the metallic patterns 222. In some embodiments, the affinity of the metallic layers 226 to the metallic patterns 222 is higher than the affinity of the metallic layers 226 to the adhesion layer 218 between the metallic patterns 222. Thus, the metallic layers 226 are generally only formed on the metallic patterns 222, and the metallic layers 226 are not formed on exposed surfaces of the adhesion layer 218 between the metallic patterns 222. Accordingly, the metallic layers 226 are separated from each other. In some embodiments, the metallic layer 226 may be formed by an atomic layer deposition (ALD) process, electroless plating process or other suitable process. The precursors of the metallic layers 226 such as silver layers have high affinity to the metallic patterns 222 and low affinity to the adhesion layer 218, and thus the precursors of the metallic layers 226 are selectively deposited on the metallic patterns 222. In one embodiment, the metallic patterns 222 (e.g., silver patterns) may be also referred to as metallic seeds (e.g., silver seeds). In some embodiments, an annealing process is further performed after forming the metallic layers 226, and thus voids or byproducts during performing the atomic layer deposition (ALD) process, the electroless plating process or other suitable process may be driven out. A temperature of the annealing process is not higher than 600° C., for example.

In some embodiments, the metallic layer 226 is formed on exposed surfaces of the metallic pattern 222 such as top surface and sidewall surfaces of the metallic pattern 222. For example, the metallic layer 226 is continuously formed on all of the top surface and the sidewall surfaces of the metallic pattern 222, and the metallic pattern 222 is encapsulated by the metallic layer 226. However, the disclosure is not limited thereto. In some alternative embodiments, based on the requirements, the metallic layer 226 may be formed at least one of the top surface and the sidewall surfaces of the metallic pattern 222. For example, the metallic layer 226 is formed on only one sidewall surface, opposite sidewall surfaces or only the top surface of the metallic pattern 222. In some embodiments, the metallic layer 226 is in direct contact with the metallic pattern 222.

In some embodiments, the etching selectivity between the metallic layer 226 and the metallic pattern 222 is high (e.g., larger than 10) with respect to an etchant used to etch the layer 210. Therefore, in the sequential removal process for the layer 210, the metallic layer 226 functions as a protection layer (e.g., a helmet) for the metallic pattern 222. For example, the metallic pattern 222 is a silver pattern, and the metallic layer 226 is a titanium layer or a cobalt layer. However, the disclosure is not limited thereto. In some embodiments, the material of the metallic layer 226 is the same as the metallic pattern 222, so as to enhance a width of the metallic pattern 222 based on the requirements. For example, the metallic pattern 222 is a silver pattern, and the metallic layer 226 is a silver layer. Further, in some embodiments, one metallic layer 226 formed on the metallic pattern 222 is illustrated. However, the disclosure is not limited thereto. In some alternative embodiments, a plurality of metallic layers 226 are formed on one metallic pattern 222, and the materials of the metallic layers 226 may be the same or different.

In some embodiments, the metallic layers 226 are separated from each other, that is, the metallic layers 226 are not connected to each other. In some embodiments, a thickness T of the metallic layer 226 on the exposed surfaces (e.g., the top surface and the sidewall surfaces) of the metallic pattern 222 may be substantially the same. A ratio of the thickness T of metallic layer 226 to the width W1 of the metallic pattern 222 may be in a range of 110 to 150. The thickness T of the metallic layer 226 may be in a range of 0.3 nm to 3 nm.

In some embodiments, the metallic patterns 222 and the metallic layers 226 thereon form a plurality of hard mask patterns 228. In some embodiments, compared to the metallic patterns 222, the hard mask patterns 228 have a rounded profile. For example, the metallic layer 226 formed on a corner of the metallic pattern 222 forms a rounded corner of the hard mask pattern 228. Further, the hard mask pattern 228 may have a convex top surface. However, the disclosure is not limited thereto. In some alternative embodiments, the hard mask pattern 228 has other suitable profile such as a pillar. For example, the hard mask pattern 228 has sharp corners and a flat top surface. The hard mask patterns 228 has a width W1' which is equal to a total of the width W1 of the metallic pattern 222, the thickness T of the metallic layer 226 on a first sidewall of the metallic pattern 222 and the thickness T of the metallic layer 226 on a second sidewall opposite to the first sidewall of the metallic pattern 222. For example, the width W1' is equal to a sum of W1 and 2T, W1'=W1+2T. In some embodiments, the width W1' of the hard mask patterns 228 is in a range of 0.1 nm to 50 nm based on the circuit layout design. In some embodiments, by forming the metallic layer 226 on the opposite sidewalls of the metallic pattern 222, a spacing S1' is formed between the hard mask patterns 228. The spacing S1' between the hard mask patterns 228 may be in a range of 0.1 nm to 50 nm. In some embodiments, the line width W1' of the hard mask patterns 228 is larger than the line width W1 of the metallic patterns 222, and the spacing S1' between the hard mask patterns 228 is smaller than the spacing S1 between the metallic patterns 222. In other words, critical dimension of the patterned hard mask is adjusted by forming the metallic layers 226 on the metallic pattern 222.

Referring to FIG. 3B, by using the patterned hard mask layer HM as a mask, the layer 210 is patterned. In some embodiments, an etching process such as a wet etching process or a dry etching process is performed on the layer 210, so as to form a plurality of patterns 212 corresponding to the hard mask patterns 228. That is, a line width W of the patterns 212 is substantially the same as the width W1' of the hard mask patterns 228, and a spacing S between the patterns 212 is substantially the same as the spacing S1' between the hard mask patterns 228. In some embodiments, the line width W of the patterns 212 is in a range of 0.1 nm to 50 nm, and the spacing S between the patterns 212 is in a range of 0.1 nm to 50 nm. In some embodiments, if the etching selectivity between the adhesion layer 218 and the layer 210 is low (e.g., smaller than 100) with respect to an etchant used in the etching process, the adhesion layer 218 may be simultaneously patterned with the layer 210, to form a plurality of adhesion patterns 219 between the hard mask patterns 228 and the patterns 212.

In some embodiments, the etching selectivity between the metallic layer 226 and the layer 210 is high (e.g., larger than 10) with respect to an etchant used to etch the layer 210. Therefore, during the patterning process, the metallic layer 226 may protect the hard mask patterns 228 from being damaged by the etchant. For example, the hard mask patterns 228 may substantially remain intact even the etching time is long or the layer 210 has a large thickness.

Referring to FIG. 3C, the patterned hard mask layer HM is removed. In some embodiments, the metallic patterns 222 and the metallic layers 226 may be simultaneously removed by using a removal solution. For example, silver patterns of the metallic patterns 222 and titanium layers and/or cobalt layers of the metallic layers 226 are simultaneously removed by hydrogen peroxide solution. However, the disclosure is not limited thereto. In some alternative embodiments, the metallic patterns 222 and the metallic layers 226 may be removed separately by different processes. Further, in some embodiments, the adhesion patterns 219 may be simultaneously removed with the hard mask patterns 228, in other words, the metallic patterns 222, the metallic layers 226 and the adhesion patterns 219 therebeneath may be removed by the same process. However, the disclosure is not limited thereto. In some alternative embodiments, the hard mask patterns 228 and the adhesion patterns 219 may be removed separately by different processes.

Then, a plurality of patterns 234 may be formed between the patterns 212. For example, a layer is formed in openings between the patterns 212 and covers the patterns 212, and then portions of the layer are removed by a planarization process. In some embodiments, the patterns 212 may be conductive patterns and have a critical dimension (e.g., line width) equal to W, and the patterns 234 may be dielectric patterns to provide electrical insulation between the patterns 212. In some alternative embodiments, the patterns 212 may be dielectric patterns, and the patterns 234 may be conductive patterns to function as conductive lines, conductive vias or the like.

FIG. 4A to FIG. 4E are schematic cross-sectional views of a patterning method in accordance with some embodiments. The step of FIG. 4A may be performed after the step of FIG. 3A, hence the same reference numerals are used to refer to the same and liked parts, and its detailed description will be omitted herein. The difference is illustrated in details below.

Figure 4A:
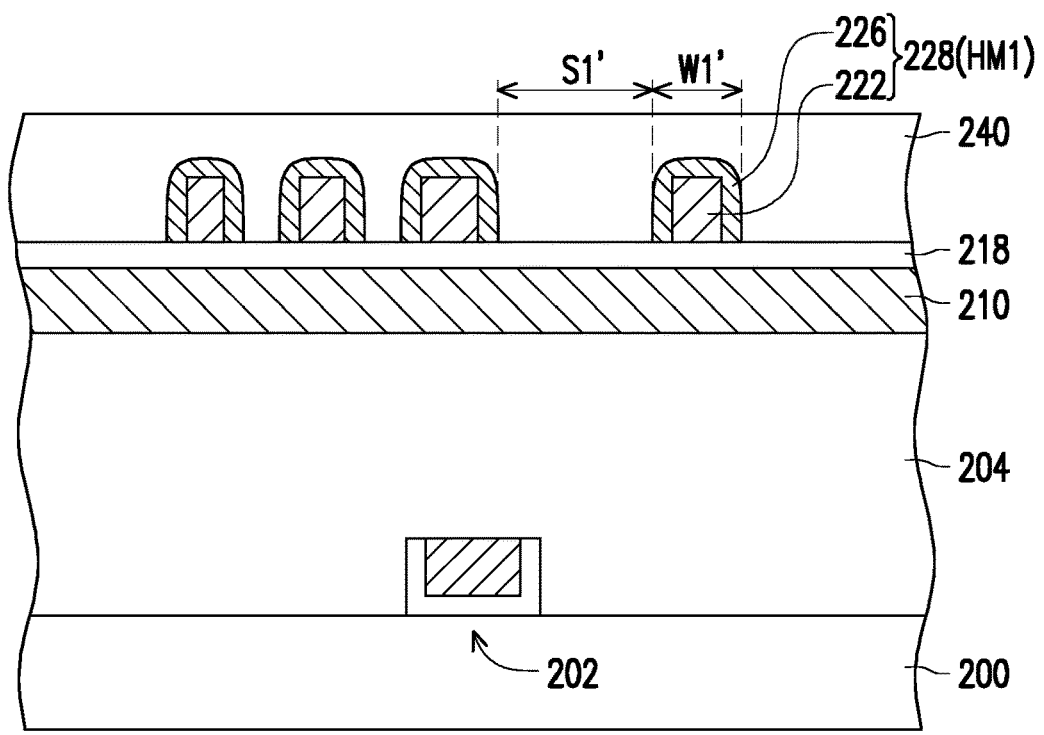
FIG. 4A to FIG. 4E are schematic cross-sectional views of a patterning method in accordance with some embodiments.

Referring to FIG. 4A, after a first patterned hard mask layer HM1 is formed, a dielectric material layer 240 is formed over the first patterned hard mask layer HM1. In some embodiments, the first patterned hard mask layer HM1 may be substantially the same as or similar to the patterned hard mask layer HM of FIG. 3A. For example, top surfaces of the hard mask patterns 228 are convex. However, the disclosure is not limited thereto. In some alternative embodiments, the first patterned hard mask layer HM1 may be substantially the same as or similar to the patterned hard mask layer HM of FIG. 2C or other suitable hard mask. In some embodiments, the dielectric material layer 240 fills in gaps between the hard mask patterns 228 and covers the hard mask patterns 228. In some embodiments, the dielectric material layer 240 includes nitride such as silicon nitride, oxide such as silicon oxide, phosphosilicate glass (PSG), borosilicate glass (BSG), boron-doped phosphosilicate glass (BPSG), a combination thereof, or the like. The dielectric material layer 240 may be formed by deposition, spin-coating, lamination or the like. For example, the dielectric material layer 240 is formed by a flowable chemical vapor deposition (CVD) process. In some embodiments, the dielectric material layer 240 may include flowable oxide.

Figure 4B:
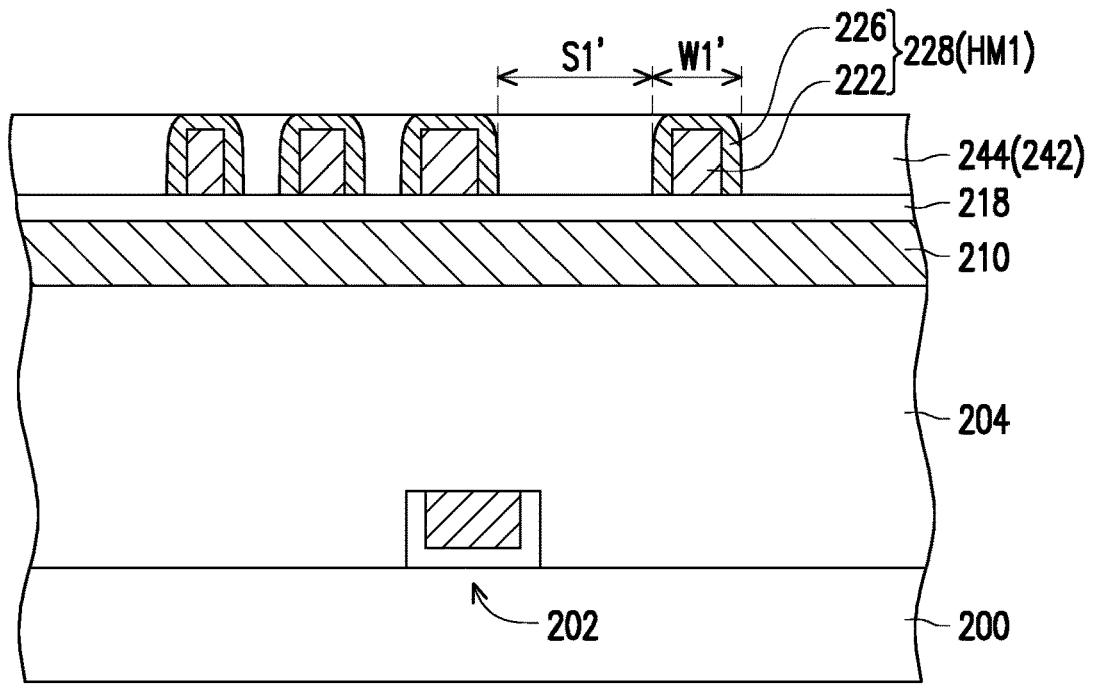

Referring to FIG. 4B, a planarization process is performed on the dielectric material layer 240, so as to form a dielectric layer 242. In some embodiments, the planarization process may be a grinding process, a chemical mechanical polishing (CMP) process or the like. After performing the planarization process, a top surface of the first patterned hard mask layer HM1 is substantially coplanar with a top surface of the dielectric material layer 240. For example, top surfaces of the hard mask patterns 228 are substantially flush with top surfaces of dielectric patterns 244 of the dielectric layer 242. The dielectric layer 242 may protect the hard mask patterns 228 from being damaged.

Figure 4C:
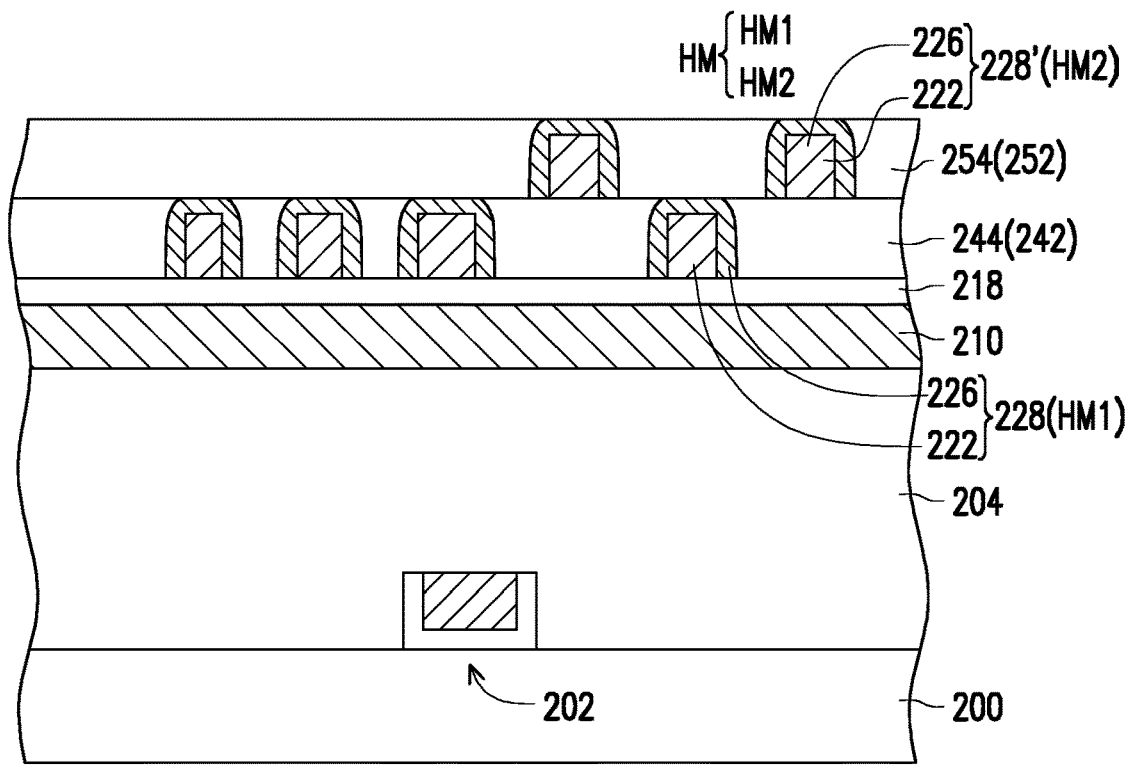

Referring to FIG. 4C, a second patterned hard mask layer HM2 is formed on the first patterned hard mask layer HM1 and the dielectric layer 242. In some embodiments, the second patterned hard mask layer HM2 may be substantially the same as or similar to the patterned hard mask layer HM of FIG. 2C, the first patterned hard mask layer HM of FIG. 3A or other suitable hard mask. For example, the second patterned hard mask layer HM2 includes a plurality of hard mask patterns 228', and the hard mask patterns 228' may have a structure substantially the same as or similar to the metallic patterns 222 or the hard mask patterns 228. In some embodiments, the hard mask patterns 228' and the hard mask patterns 228 are alternately disposed in a horizontal direction. For example, the hard mask pattern 228' is disposed between two adjacent hard mask patterns 228. In some embodiments, a width of the hard mask pattern 228' is smaller than a spacing between the two adjacent hard mask patterns 228.

Then, a dielectric layer 252 is formed over the first patterned hard mask layer HM1 and the dielectric layer 242. In some embodiments, the dielectric layer 252 includes a plurality of dielectric patterns 254 between the hard mask patterns 228'. A forming method and material of the dielectric layer 252 may be similar to the dielectric layer 242, and thus the details are omitted herein. Further, in some alternative embodiments, the dielectric layer 252 may be omitted. In some embodiments, the first patterned hard mask layer HM1 and the second patterned hard mask layer HM2 may be collectively referred to as a double patterning hard mask layer HM.

Figure 4D:
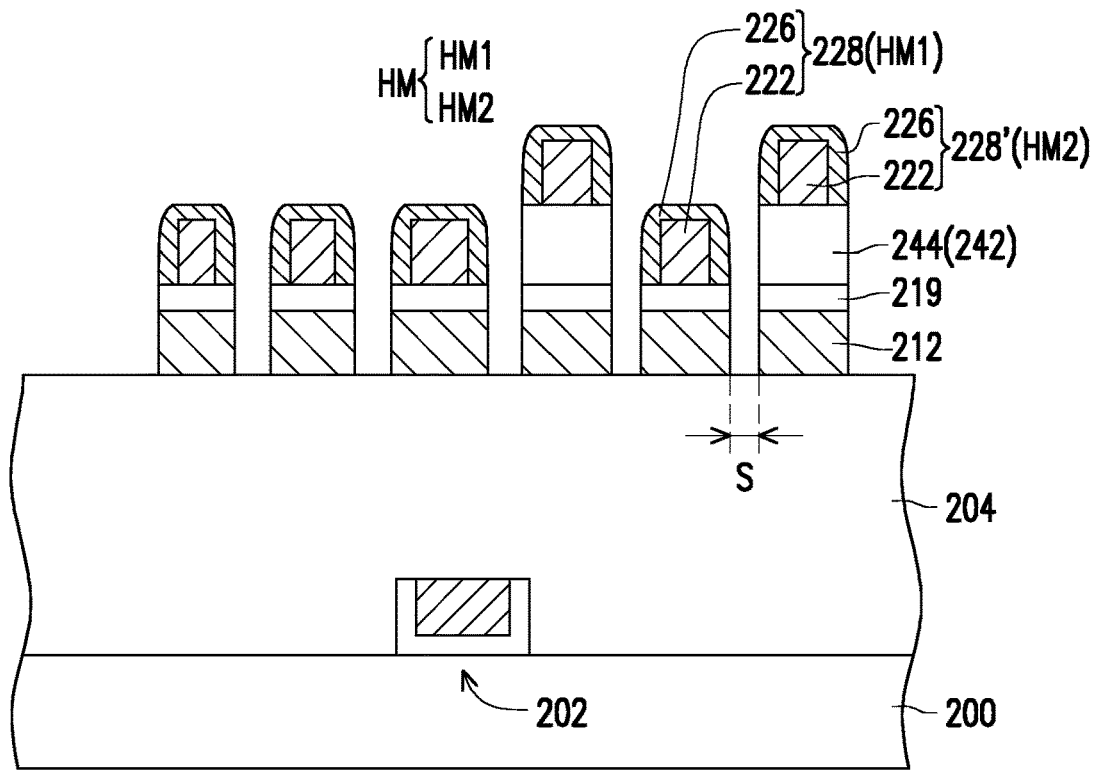
Figure 4E:
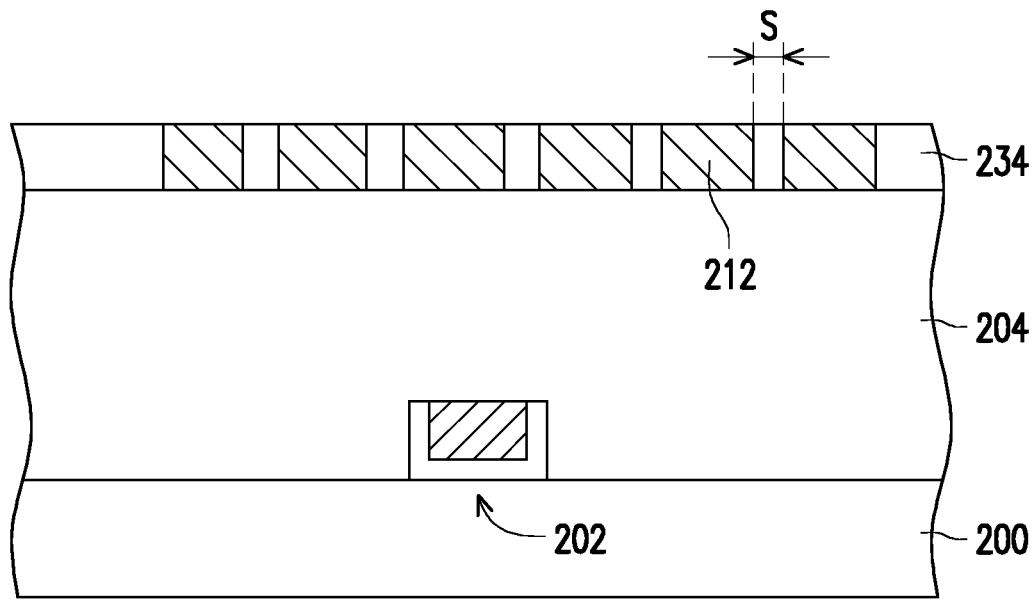

Referring to FIG. 4D, by using the double patterning hard mask layer HM as a mask, an etching process is performed on the layer 210, so as to form a plurality of patterns 212. In some embodiments, the etching process may also remove the dielectric layer 252, a portion of the dielectric layer 242 not covered by the hard mask patterns 228' and portions of the adhesion layer 218 not covered by the hard mask patterns 228, 228'. In some embodiments, by double patterning, a small spacing S of the patterns 212 may be formed. For example, compared to the spacing S between the patterns 212 of FIG. 3C, the spacing S between the patterns 212 of FIG. 4D is smaller. In some embodiments, the spacing S between the patterns 212 formed by double patterning may be in a range of 0.1 to 25.

Then, a plurality of patterns 234 may be formed between the patterns 212. For example, a layer is formed in openings between the patterns 212 and covers the patterns 212, and then portions of the layer are removed by a planarization process. In some embodiments, the patterns 212 may be dielectric patterns, and the patterns 234 may be conductive patterns to function as conductive lines, conductive vias or the like. In this case, the patterns 234 have a critical dimension (e.g., line width) equal to S. However, the disclosure is not limited thereto. In some alternative embodiments, the patterns 212 may be conductive patterns, and the patterns 234 may be dielectric patterns.

Figure 5A:
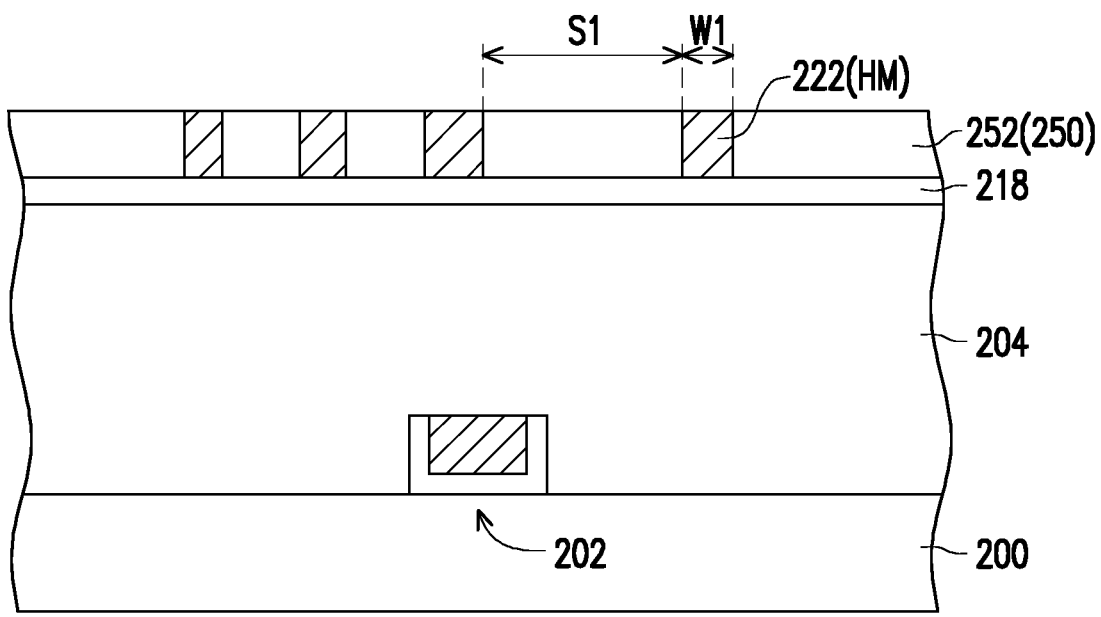
FIG. 5A to FIG. 5C are schematic cross-sectional views of a patterning method in accordance with some embodiments.
Figure 5B:
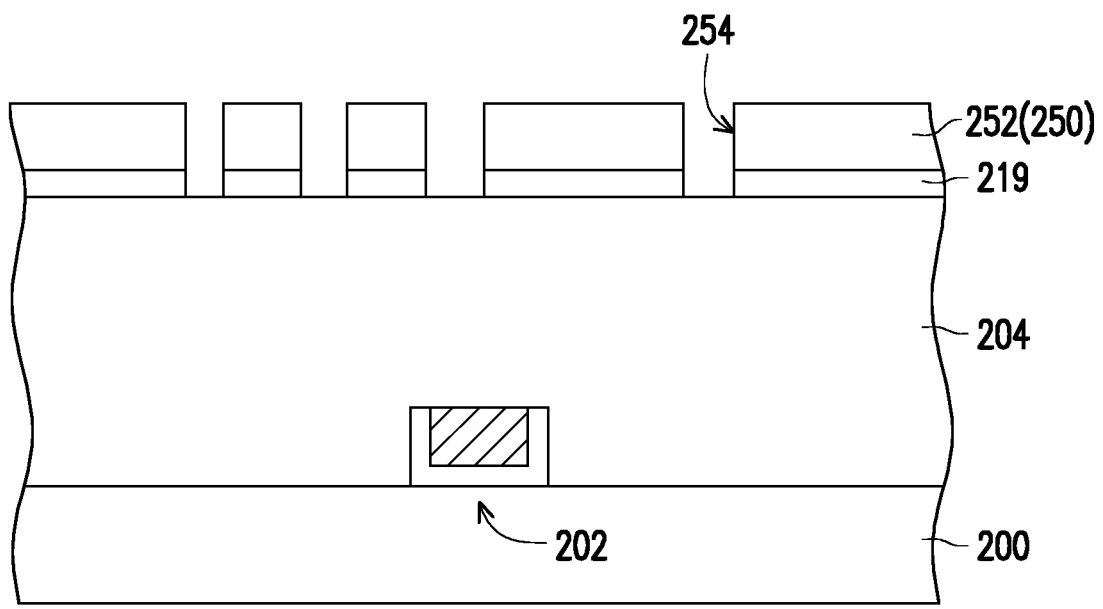
Figure 5C:
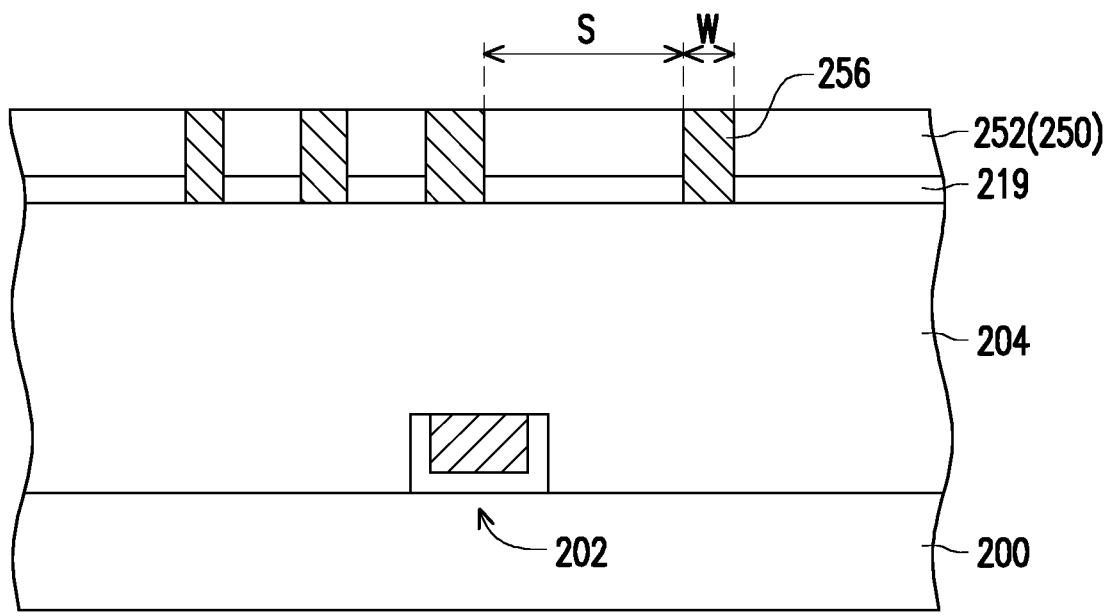

FIG. 5A to FIG. 5C are schematic cross-sectional views of a patterning method in accordance with some embodiments. The step of FIG. 5A may be performed after the step of FIG. 2C, hence the same reference numerals are used to refer to the same and liked parts, and its detailed description will be omitted herein. The difference is illustrated in details below.

Referring to FIG. 5A, after forming the hard mask layer HM, a dielectric layer 250 is formed to fill gaps between the metallic patterns 222. In some embodiments, the metallic patterns 222 have the width W1 and the spacing S1, for example. In some embodiments, the dielectric layer 250 includes a plurality of dielectric patterns 252, and the dielectric patterns 252 are disposed between the metallic patterns 222. For example, a dielectric material is formed over the hard mask layer HM to fill the gaps openings between the metallic patterns 222 and covers the metallic patterns 222, and then portions of the dielectric material outside the gaps are removed by a planarization process. In some embodiments, the dielectric layer 250 includes oxide such as flowable oxide and silicon oxide, nitride such as silicon nitride, phosphosilicate glass (PSG), borosilicate glass (BSG), boron-doped phosphosilicate glass (BPSG), a combination thereof, or the like. The dielectric material layer 240 may be formed by deposition, spin-coating, lamination or the like. For example, the dielectric material layer 240 is formed by a flowable chemical vapor deposition (CVD) process. In some embodiments, the dielectric material layer 240 may be flowable oxide.

Referring to FIG. 5B, the hard mask layer HM is removed, so as to form a plurality of openings 254 between the dielectric patterns 252. In some embodiments, the etching selectivity between the hard mask layer HM and the dielectric layer 250 is high (e.g., larger than 10) with respect to the etchant used to remove the hard mask layer HM. In some embodiments, a width of the opening 254 is substantially the same as the width W1 of the metallic pattern 222. In some embodiments, portions of the adhesion layer 218 below the hard mask layer HM may be removed simultaneously with the adhesion layer 218. Thus, a plurality of adhesion patterns 219 are formed below the dielectric patterns 252.

Referring to FIG. 5C, then, a plurality of conductive patterns 256 are formed in the openings 254. In some embodiments, the openings 254 are formed by removing the metallic patterns 222, and thus the conductive patterns 256 have a line width W and a spacing S substantially the same as the width W1 and the spacing S1 of the metallic patterns 222.

In some embodiments, the conductive patterns 256 are formed by a deposition process and a planarization process, in other words, the etching process is not required. In addition, since the metallic patterns 222 may be formed with a small line width such as ranging from 0.1 nm to 30 nm, the conductive patterns 256 may also have the small line width accordingly.

In some embodiments, the patterned hard mask layer may be formed by carrying out a chemical reduction reaction of the metal compound with a ray exposure such as gamma ray exposure. In some alternative embodiments, a width of the hard mask pattern may be enhanced by an atomic layer deposition (ALD) process, electroless plating process or the like. Accordingly, a critical dimension below 3 nm may be achieved.

According to some embodiments, a method of patterning a material layer includes the following steps. A first material layer is formed over a substrate, and the first material layer includes a first metal compound. Through a first photomask, portions of the first material layer is exposed with a gamma ray, wherein a first metal ion of the first metal compound in the portions of the first material layer is chemically reduced to a first metal grain. Other portions of the first material layer are removed to form a plurality of first hard mask patterns including the first metal grain.

According to some embodiments, a method of patterning a material layer includes the following steps. A material layer including a metal salt is formed over a substrate. Portions of the material layer are chemically reduced to form a plurality of metallic patterns. Unreduced portions of the material layer are removed. A plurality of metallic layers are formed on exposed surfaces of the metallic patterns respectively, to form a plurality of hard mask patterns comprising the metallic patterns and the metallic layers.

According to some embodiments, a method of patterning a material layer includes the following steps. A material layer is formed over a layer, and the material layer includes a metal salt. Portions of the material layer are chemically reduced to form a plurality of metallic patterns by exposing with a gamma ray. Unreduced portions of the material layer are removed, to form a hard mask layer. By using the hard mask layer including the metallic patterns as a mask, portions of the layer are removed. The hard mask layer is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning a material layer, comprising:
    forming a first material layer over a substrate, the first material layer comprising a first metal compound;
    through a first photomask, exposing portions of the first material layer with a gamma ray, wherein a first metal ion of the first metal compound in the portions of the first material layer is chemically reduced to a first metal grain; and
    removing other portions of the first material layer, to form a plurality of first hard mask patterns comprising the first metal grain.

2. The method of claim 1, wherein the first metal compound comprises silver salt, and the first hard mask patterns comprise silver patterns.

3. The method of claim 1, further comprising:
    forming a second material layer over the plurality of first hard mask patterns, the second material layer comprising a second metal compound;
    through a second photomask, exposing portions of the second material layer with a gamma ray, wherein a second metal ion of the second metal compound in the portions of the second material layer is chemically reduced to a second metal grain; and
    removing other portions of the second material layer, to form a plurality of second hard mask patterns comprising the second metal grain, wherein the first hard mask patterns and the second hard mask patterns are alternately disposed.

4. The method of claim 1, further comprising:
    forming an adhesion layer between the first material layer and the substrate; and
    after forming the first hard mask patterns, patterning the adhesion layer by using the first hard mask patterns as a mask, to form a plurality of adhesive patterns.

5. The method of claim 1, further comprising:
    forming a layer between the first material layer and the substrate; and after forming the first hard mask patterns, patterning the layer by using the first hard mask patterns as a mask, to form a plurality of first patterns.

6. The method of claim 5, further comprising forming a plurality of second patterns between the first patterns.

7. The method of claim 1, further comprising:
forming a layer on the substrate;
forming an adhesion layer on the layer;
forming the first material layer on the adhesion layer;
after forming the first hard mask patterns, simultaneously patterning the adhesion layer and the layer by using the first hard mask patterns as a mask.

8. A method of patterning a material layer, comprising:
forming a material layer comprising a metal salt over a substrate;
chemically reducing portions of the material layer to form a plurality of metallic patterns; and
removing unreduced portions of the material layer, to form a plurality of hard mask patterns comprising the metallic patterns.

9. The method of claim 8, further forming a plurality of metallic layers on exposed surfaces of the metallic patterns respectively, wherein the metallic layers are formed on top surfaces and sidewall surfaces of the metallic patterns, and the metallic layers are separated from each other.

10. The method of claim 8, further forming a plurality of metallic layers on exposed surfaces of the metallic patterns respectively, wherein the metallic layers are formed by an atomic layer deposition process or an electroless plating process.

11. The method of claim 8, further comprising forming an adhesion layer between the substrate and the material layer, and patterning the adhesion layer by using the hard mask patterns as a mask.

12. The method of claim 8, wherein chemically reducing portions of the material layer comprises exposing the portions of the material layer with a gamma ray.

13. The method of claim 8, further forming a plurality of metallic layers on exposed surfaces of the metallic patterns respectively, wherein a metal of the metallic patterns is different from a metal of the metallic layers.

14. The method of claim 8, further forming a plurality of metallic layers on exposed surfaces of the metallic patterns respectively, wherein a metal of the metallic patterns is the same as a metal of the metallic layers.

15. A method of patterning a material layer, comprising:
forming a material layer over a layer, the material layer comprising a metal salt;
by exposing with a gamma ray, chemically reducing portions of the material layer to form a plurality of metallic patterns;
removing unreduced portions of the material layer, to form a hard mask layer;
by using the hard mask layer comprising the metallic patterns as a mask, removing portions of the layer; and
removing the hard mask layer.

16. The method of claim 15, further comprising:
after removing the unreduced portions, forming a plurality of metallic layers on the metallic patterns respectively; and
removing portions of the layer by etching the layer through the hard mask including the metallic patterns and the metallic layers.

17. The method of claim 16, wherein the metallic layers and the layer have a first etching selectivity with respect to an etchant used to remove the portions of the layer, the metallic patterns and the layer have a second etching selectivity with respect to the etchant, and the first etching selectivity is larger than the second etching selectivity.

18. The method of claim 15, further comprising forming a dielectric layer to fill gaps between the metallic patterns.

19. The method of claim 18, wherein forming the dielectric layer comprises:
forming a dielectric material layer over the metallic patterns; and
performing a planarization process on the dielectric material layer, wherein a top surface of the dielectric layer is substantially coplanar with top surfaces of the metallic patterns after the planarization process.

20. The method of claim 18, further comprising:
forming a plurality of hard mask patterns between and over the metallic patterns on the dielectric layer; and
by using the hard mask layer comprising the metallic patterns and the hard mask patterns as the mask, removing the portions of the layer.

* * * * *